(12) United States Patent
Sekar et al.

(10) Patent No.: US 9,570,165 B2
(45) Date of Patent: Feb. 14, 2017

(54) 1D-2R MEMORY ARCHITECTURE

(71) Applicant: Rambus Inc., Sunnyvale, CA (US)

(72) Inventors: Deepak Chandra Sekar, San Jose, CA (US); Gary Bela Bronner, Los Altos, CA (US); Christophe J. Chevallier, Palo Alto, CA (US); Lidia Vereen, San Ramon, CA (US); Philip F. S. Swab, Santa Rosa, CA (US); Elizabeth Friend, Sunnyvale, CA (US); Mehmet Gunhan Ertosun, Mountain View, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 14/568,011

(22) Filed: Dec. 11, 2014

(65) Prior Publication Data
US 2015/0162382 A1    Jun. 11, 2015

Related U.S. Application Data

(60) Provisional application No. 61/914,638, filed on Dec. 11, 2013.

(51) Int. Cl.
| | |
|---|---|
| G11C 11/00 | (2006.01) |
| G11C 13/00 | (2006.01) |
| G11C 11/56 | (2006.01) |
| H01L 27/24 | (2006.01) |
| H01L 45/00 | (2006.01) |

(52) U.S. Cl.
CPC ......... *G11C 13/004* (2013.01); *G11C 11/5685* (2013.01); *G11C 13/003* (2013.01); *G11C 13/0069* (2013.01); *H01L 27/2409* (2013.01); *G11C 13/0004* (2013.01); *G11C 13/0007* (2013.01); *G11C 2013/0088* (2013.01); *G11C 2213/72* (2013.01); *G11C 2213/78* (2013.01); *H01L 45/04* (2013.01); *H01L 45/1226* (2013.01); *H01L 45/1233* (2013.01); *H01L 45/146* (2013.01)

(58) Field of Classification Search
CPC ... G11C 13/0002; G11C 11/14; G11C 13/0004
USPC ................................. 365/148, 163, 171, 173
See application file for complete search history.

(56) References Cited

U.S. PATENT DOCUMENTS

| | | | |
|---|---|---|---|
| 2006/0139991 A1* | 6/2006 | Aoki | G11C 11/16 365/158 |
| 2008/0025131 A1* | 1/2008 | Scheuerlein | G11C 8/08 365/230.06 |
| 2009/0014836 A1* | 1/2009 | Lee | G11C 13/0004 257/536 |
| 2014/0268990 A1* | 9/2014 | Hong | G11C 13/0004 365/148 |

\* cited by examiner

*Primary Examiner* — Han Yang
(74) *Attorney, Agent, or Firm* — Lowenstein Sandler LLP

(57) ABSTRACT

A memory device includes an array of resistive memory cells. Each resistive memory cell in the array includes a first resistive memory element, a second resistive memory element, and a two-terminal switching element. The first resistive memory element is electrically coupled to the second resistive memory element and to the switching element at a common node.

15 Claims, 9 Drawing Sheets

1D-2R MEMORY ARCHITECTURE

RELATED APPLICATIONS

The present disclosure is related to U.S. Provisional Application No. 61/914638, filed Dec. 11, 2013, which is incorporated herein by reference in its entirety.

TECHNICAL FIELD

We disclose a one diode, two resistive element (1D-2R) memory cell and an associated memory device architecture.

BACKGROUND

Non-volatile memory devices that retain stored data in the absence of power are pervasively used in many electronic products including cell phones, tablets, personal computers, personal digital assistants, and the like. Unfortunately, many non-volatile memory devices have limitations that make them unsuitable for use as primary storage for these products including higher cost and lower performance when compared to volatile memory devices such as dynamic random access memory (DRAM). Examples of non-volatile memory devices include read-only memory (ROM), flash memory, ferroelectric random access memory (FRAM), resistive random access memory (RRAM), phase change memory, and the like.

RRAM memory devices are a focal point for current development. In some instances, RRAM memory devices are implemented as a three-dimensional (3D) crosspoint memory array having vertically stacked and interconnected layers. Each layer may comprise an array of RRAM memory elements, formed at intersections of bit lines and word lines placed orthogonal to each other. RRAM memory devices formed on a layer may be interconnected to RRAM memory devices formed on other layers.

RRAM memory devices may further be implemented as horizontal 3D crosspoint memory arrays and vertical 3D crosspoint memory arrays. Horizontal 3D crosspoint memory arrays having 1D-1R (one diode, one resistive element) often use unipolar diodes as select devices. These unipolar diodes, however, cannot service popular bipolar RRAM memory devices. Vertical 3D crosspoint memories use a shared transistor to select between multiple RRAM devices. Sneak paths in the array limit the block size, however, which adversely impacts manufacturing costs. A need exists, therefore, for an improved RRAM memory device.

BRIEF DRAWINGS DESCRIPTION

DETAILED DESCRIPTION

Figure 1A:
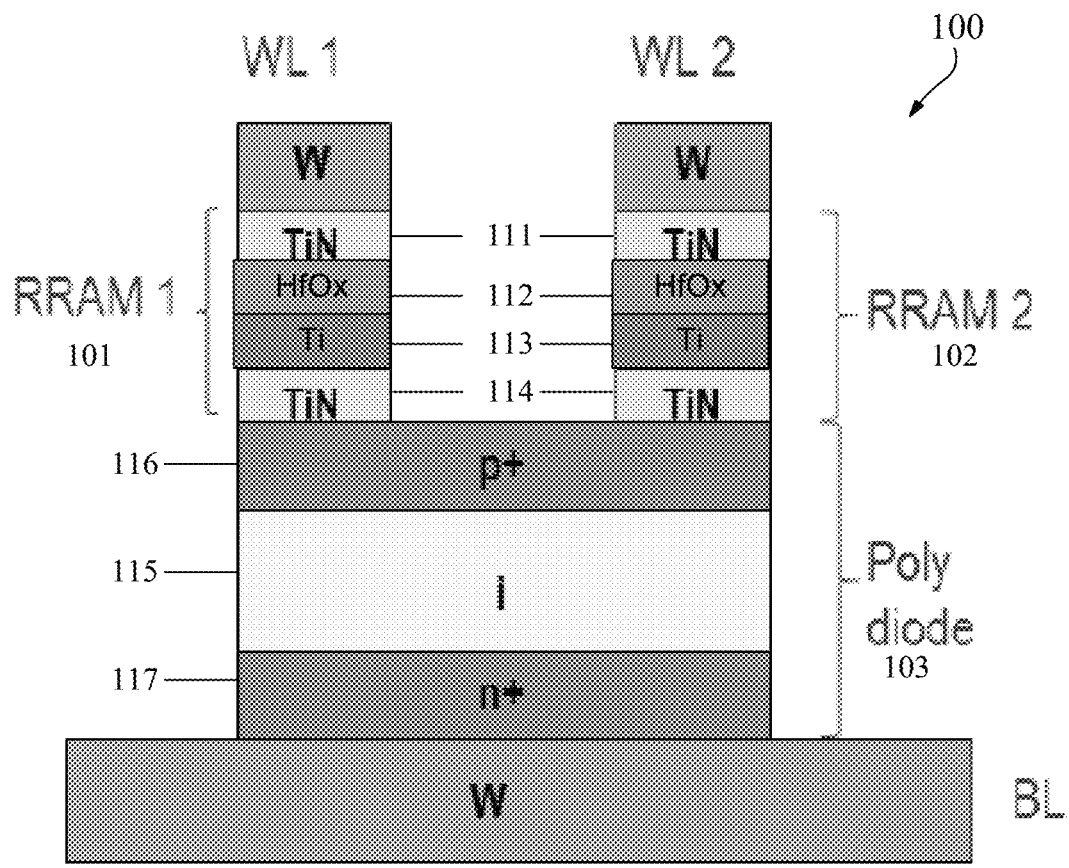
FIG. 1A is a diagram of an embodiment of a memory cell according to the present disclosure.
Figure 1B:
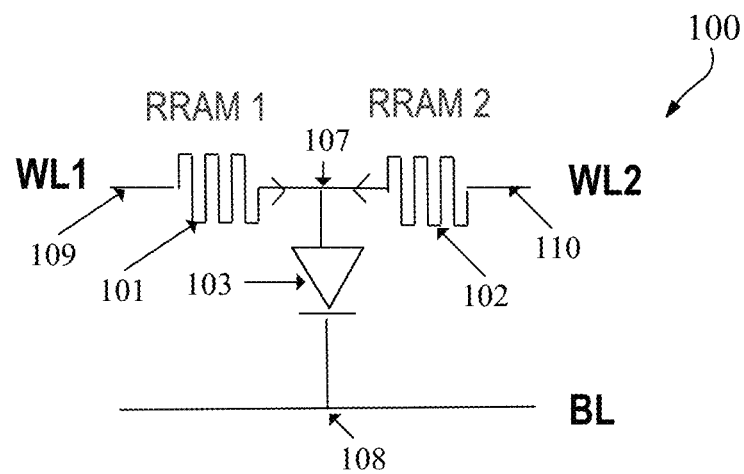
FIG. 1B is a circuit diagram of the memory cell 100 shown in FIG. 1A.

FIGS. 1A and 1B are a diagram and a circuit diagram, respectively, of a memory cell 100. Referring to FIGS. 1A and 1B, a memory cell 100 includes a first resistive memory element 101, a second resistive memory element 102, and a switching element 103, hence the designation 1D-2R cell (one diode-two resistive memory elements). An array of 1D-2R cells are designated as a DiRAM array—for Diode RAM array—in the present disclosure.

First resistive memory element 101 is electrically coupled to second resistive element 102 at a common node 107. Switching element 103 is electrically coupled to first resistive element 101 and second resistive memory element 102 at common node 107.

First resistive memory element 101 or second resistive memory element 102 may comprise non-volatile resistive memory of any technology that retains stored information in the absence of power. Examples of non-volatile resistive memory technology include resistive random access memory (RRAM).

First resistive memory element 101 and second resistive memory element 102 may comprise a complementary memory cell in which first resistive memory element 101 comprises a polarity that is different, opposite, or complementary to that of second resistive memory element 102.

Switching element 103 may be electrically coupled to common node 107 at a first terminal and electrically coupled to a bit line signal 108 at a second end. Switching element 103 may comprise any two-terminal switching device of any technology known to a person of ordinary skill in the art, e.g., a polysilicon diode. Switching element 103 may comprise a diode having a lightly doped intrinsic semiconductor region 115 sandwiched between a p+ semiconductor region 116 and an n+ semiconductor region 117. Switching element 103 may start conducting at any of a variety of settings, including e.g., 0.7V. Switching element 103 may have minimal leakage, e.g., in the sub-picoampere (pA), in the reverse direction.

Figure 1C:
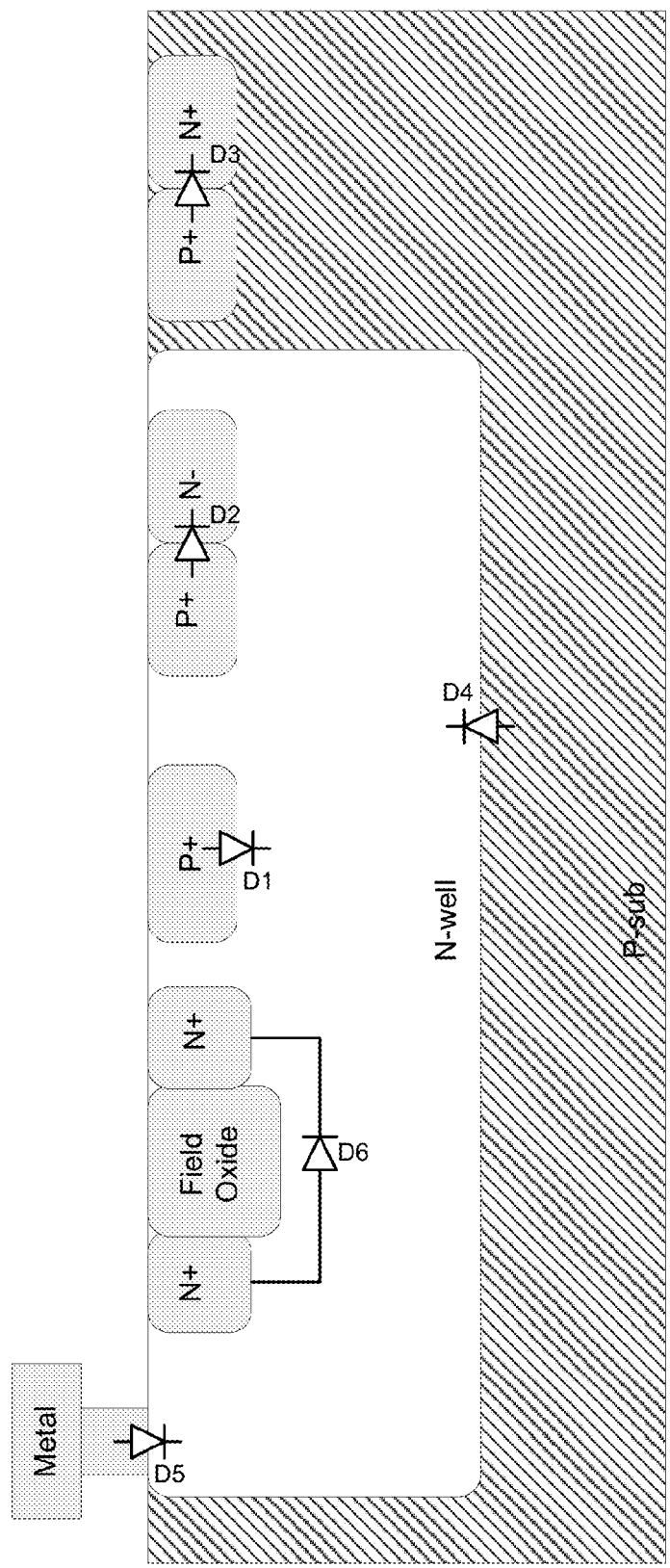
FIG. 1C is a diagram of embodiments of the switching element shown in FIGS. 1A and 1B.

Switching element 103 may also comprise any type of diode manufactured using CMOS (Complementary Metal Oxide Semiconductor) processes including diodes D1-D6 shown in FIG. 1C and referenced in Table 1.

TABLE 1

| Diode Name | Diode Location |
| --- | --- |
| D1 | P+ doping and N-well |
| D2 | P+ doping and N+ doping in N-well |
| D3 | P+ doping and N+ doping in P-sub |
| D4 | P-sub and N-well |
| D5 | Schottky diode between contact and N-well |
| D6 | P+ doping and N-well with field oxide |

First resistive memory element 101 may be electrically coupled between common node 107 and a first word line signal WL1 at 109. Likewise, second resistive memory element 102 may be electrically coupled between a common node 107 and a second word line signal WL2 at 110. First resistive memory element 101 and second resistive memory element 102 may comprise a titanium nitride 111, titanium 112, hafnium oxide 113, and titanium nitride 114 (TiN/HfOx/Ti/TiN) stack. A person of ordinary skill in the art will readily identify other possible combinations of materials that may be used in the manufacture of first resistive memory element 101 or second resistive memory element 102.

Memory cell 100 may be constructed using a first lithography step to form the BL using e.g., tungsten, a second lithography step to form the switching element 103, and a third lithography step to define the resistive memory elements 101 and 102, as well as the word line signals WL1 and WL2. A person of ordinary skill in the art will recognize other methods of constructing memory cell 100.

Exemplary operating characteristics of memory cell 100 are as follows:
FORM=3V
RESET=1.5V, 1 uA
SET=1V, 200 nA
ON/OFF resistance=1 Mohm, 50 Mohm
Switching time=1 us at the array level A person of ordinary skill in the art will recognize that the operating characteristics of memory cell 100 may change depending on a variety of factors including design or manufacturing constraints.

Figure 2A:
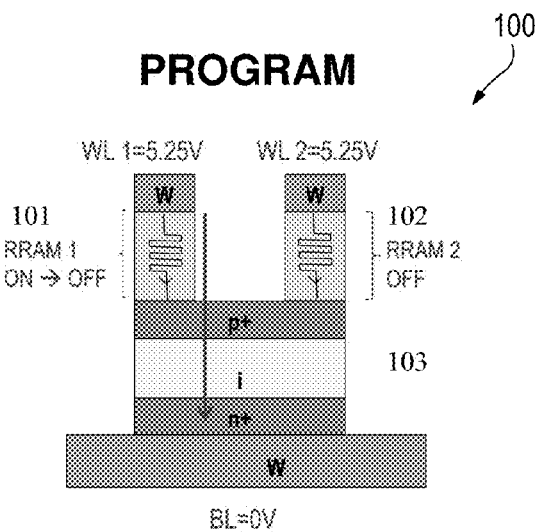
FIG. 2A is a diagram of the memory cell 100 shown in FIGS. 1A and 1B during a program operation.

FIG. 2A is a diagram of memory cell 100 shown in FIGS. 1A and 1B during a program operation. A form operation for memory cell 100 is similar to the program operation shown in FIG. 2A. Referring to FIGS. 1A, 1B, and 2A, memory cell 100 is configured to store at least two bits of information based at least in part on the first resistive memory element 101 or the second resistive memory element 102 being configured in an OFF or high resistance state, an ON or low resistance state, an intermediate state (i.e., a state between a high resistance state and a low resistance state), or combinations thereof. In an embodiment, first resistive memory element 101 will be in ON to present a low impedance, e.g., 1MΩ. Since second resistive memory element 102 comprises a polarity that is different, opposite, or complementary to that of first resistive memory element 101, second resistive memory element 102 will be OFF to present a high impedance, e.g., 50 MΩ.

During a program operation, memory cell 100 may be biased to allow programming first or second resistive memory elements 101 or 102, respectively, using switching element 103. Word line signals WL1 and WL2 and bit line signal BL may be set such that the voltage difference between them is capable of changing the conductivity of first resistive memory element 101 or second resistive memory element 102 from one state to another, e.g., OFF to ON. In an embodiment, word line signals WL1 and WL2 may be set to 5.25V and the bit line signal BL may be set to 0V. Because the voltage difference across switching element 103 is sufficient to turn ON switching element 103, current flows from first word line signal WL1 to bit line signal BL to program first resistive memory element 101 to an OFF state from an ON state. Since first resistive memory element 101 is initially ON, virtually no current flows from second word line signal WL2 to bit line signal BL since second resistive memory element 102 is OFF to present a high impedance, e.g., 50 MΩ (or in a state complementary to a state of the first resistive memory element 101). A person of ordinary skill in the art will recognize that the bias voltages applied to the word line signals WL1 and WL2 and the bit line signal BL may change depending on a variety of factors including design or manufacturing constraints.

Figure 2B:
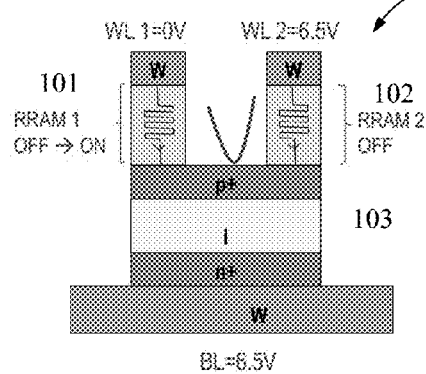
FIG. 2B is a diagram of the memory cell 100 shown in FIGS. 1A and 1B during an erase operation.

FIG. 2B is a diagram of memory cell 100 shown in FIGS. 1A and 1B during an erase operation. Referring to FIGS. 1A, 1B, and 2B, in an embodiment, first resistive memory element 101 and second resistive memory element 102 will initially be OFF to present high impedance, e.g., 50MΩ. During the erase operation, word line signal WL2 and bit line signal BL may be set to 6.5V, while word line signal WL1 may be set to a ground voltage. The voltage difference between word line WL2 and bit line signal BL may be insufficient to turn ON switching element 103. Since switching element 103 is turned OFF, the 6.5V difference between word line signals WL1 and WL2 is applied across the serially coupled first resistive memory element 101 and second resistive memory element 102.

First resistive memory element 101 and second resistive memory element 102 act as a divider to the voltage difference between word line signals WL1 and WL2 which, in turn, may cause an erase current to flow from second resistive memory element 102 to first resistive memory element 101. If the erase current is high enough, it may change the state of first resistive memory element 101 from OFF to ON. Note that only first resistive memory element 101 will change state due to the polarity of the bias voltages applied to first resistive memory element 101 and second resistive memory element 102. Second resistive memory element 102 will not change state because its polarity is complementary to the polarity of first resistive memory element 101.

Any disturb that occurs to second resistive memory element 102 may be corrected by, e.g., re-programming second resistive memory element 102 using switching element 103 biased as shown in FIG. 2A.

A person of ordinary skill in the art will recognize that first resistive memory element 101 and second resistive memory element 102 may be either in a same state, e.g., ON/ON or OFF/OFF after the program operation, or in opposite states, e.g., ON/OFF or OFF/ON, after the erase operation.

Figure 2C:
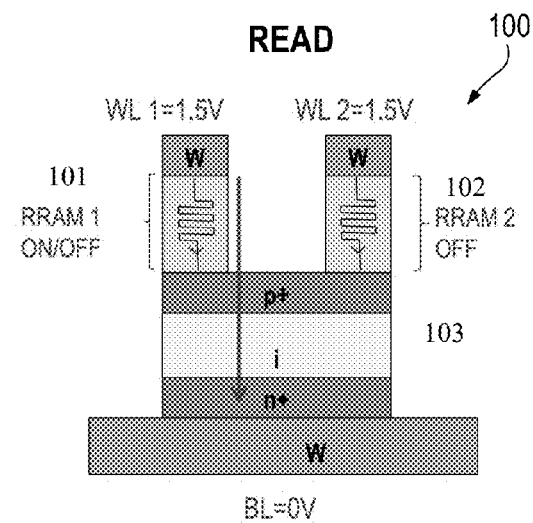
FIG. 2C is a diagram of the memory cell 100 shown in FIGS. 1A and 1B during a read operation.

FIG. 2C is a diagram of memory cell 100 shown in FIG. 1 during a read operation. Referring to FIGS. 1A, 1B, and 2C, a read operation may involve biasing word line signals WL1 and WL2 and bit line signal BL to enable use of switching element 103 as a selector. In an embodiment, word line signals WL1 and WL2 are set to 1.5V and bit line signal BL is set to a ground voltage.

The difference between the voltage at word line signal WL1 and the voltage at bit line signal BL causes a current to flow through first resistive memory element 101 and switching element 103, which can be read by downstream control circuitry (not shown) applied to word line signal WL1 to sense the value stored in first resistive memory element 101. This is because the value stored depends on whether first resistive memory element 101 is ON or OFF, which, in turn, affects the current flowing through the first resistive memory element 101. The current forms the basis upon which the downstream control circuitry determines the value stored in first resistive memory element 101. In an embodiment, a metal-insulator-metal or MIM diode (not shown) may be added to the memory cell 100 in series with the first and second resistive memory elements 101 and 102 to provide a non-linearity in their corresponding current/voltage (I/V) characteristics to thereby further reduce or eliminate sneak paths. Downstream control circuitry configured to control memory cell 100 is well known to a person of ordinary skill in the art and will not be explained in any further detail herein.

Figure 3A:
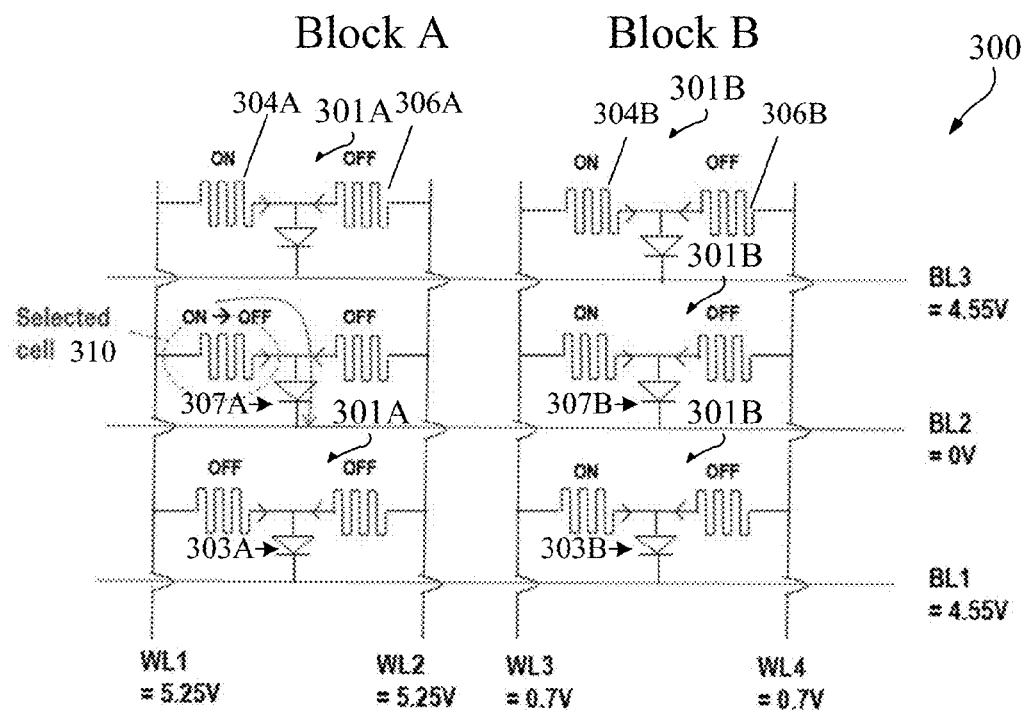
FIG. 3A is a diagram of an embodiment of a DiRAM array during a program or read operation.
Figure 3B:
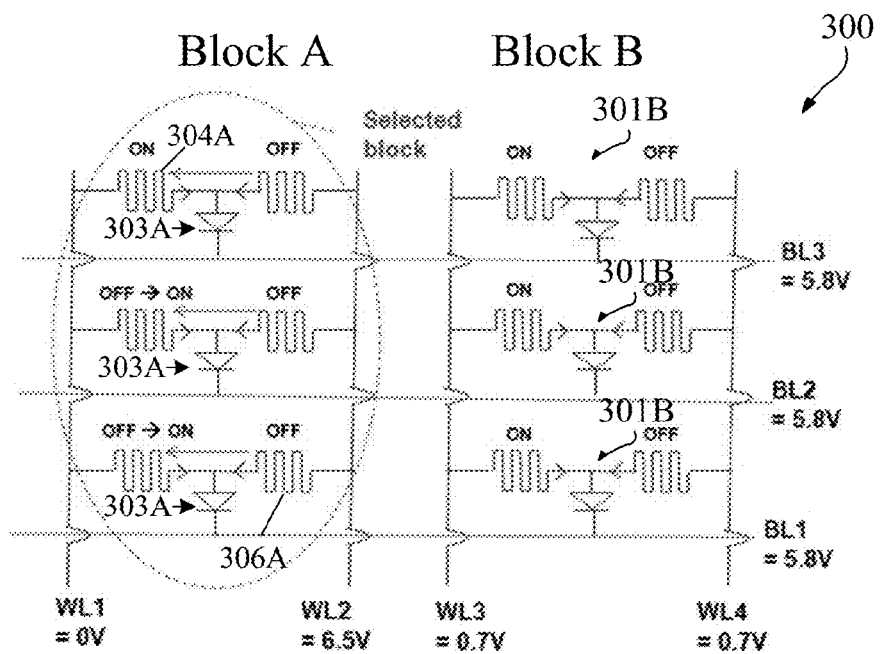
FIG. 3B is a diagram of an embodiment of a DiRAM array during an erase operation.

FIG. 3A is a diagram of an embodiment of a DiRAM array 300 during a program or read operation. FIG. 3B is a diagram of an embodiment of a DiRAM array during an erase operation. Referring to FIG. 3A, a DiRAM array 300 comprises a plurality of memory cells 301A and 301B arranged in columns and rows. In an embodiment, at least a portion of the plurality of memory cells 301A or 301B may be arranged in a vertical stack to comprise a 3D crosspoint memory array. Each layer may comprise an array of RRAM memory elements, formed at intersections of bit lines and word lines placed orthogonal to each other. RRAM memory devices formed on a layer may be interconnected to RRAM memory devices formed on other layers using vias.

Word line signals WL1, WL2, WL3, and WL4 may be arranged in a column direction and bit line signals BL1, BL2, and BL3 may be arranged in a row direction between memory cells 301A and 301B. In block A, memory cells 301A are electrically coupled between a pair of word line signals WL1 and WL2. More specifically, word line signal WL1 is electrically coupled to first resistive memory elements 304A and word line signal WL2 is electrically coupled to second resistive memory elements 306A. Likewise, in block B, memory cells 301B are electrically coupled between a pair of word line signals WL3 and WL4. Word line signal WL3 is electrically coupled to first resistive memory elements 304B and word line signal WL4 is electrically coupled to second resistive memory elements 306B. Bit line signals may be electrically coupled to the switching elements. For example, bit line signal BL1 may be electrically coupled to switching elements 303A and 303B, while bit line signal BL2 is electrically coupled to switching elements 307A and 307B, and so on.

DiRAM 300 may be biased to read or program a selected cell 310 in block A. In an embodiment, word line signals WL1 and WL2 are set to 5.25V and bit line BL2 is set to a ground voltage creating a voltage drop across switching element 307A. The voltage difference between word line signals WL1 or WL2 and bit line signal BL2 of selected cell 310 is greater than a threshold voltage necessary to turn ON switching element 307A, which acts to select memory cell 310 for the program or read operation.

Bit line signals coupled to unselected cells, e.g., bit line signals BL1 and BL3, are biased such that the voltage difference between a bit line and a word line of an unselected cell in block A is less than a threshold voltage necessary to turn ON switching elements thus preventing any current flow though corresponding switching elements 303A, etc. In an embodiment shown in FIG. 3A, word line signals WL3 and WL4 are set to 0.7V and bit line signals BL1 and BL3 are set to 4.55V, creating a negative voltage drop across all switching elements in block B (e.g., elements 303B and 307B) insufficient to turn ON switching elements 303B and 307B.

Referring to FIG. 3B, DiRAM 300 may be configured for a block level erase operation. In an embodiment in which Block A is to be erased, all bit line signals and word line signals associated with block A are biased such that a voltage drop appears across resistive memory elements 304A and 306A while switching element 303A remains turned off. The combination of first resistive memory element 304A and second resistive memory element 306A divide the voltage drop between word line signal WL2 and word line signal WL1 causing a current to flow from second resistive memory element 306A to first resistive memory element 304A. If the current is high enough, it may change the state of resistive memory elements 304A from OFF to ON. Note that only first resistive memory elements 304A will change state since the polarity of first resistive memory element 304A is suitable for a state change while second resistive memory elements 306A will not change state due to their polarity being complementary to the polarity of first resistive memory elements 304A.

A person of ordinary skill in the art should recognize that the bias levels indicated above are only exemplary and may vary depending on a variety of factors including design or manufacturing constraints.

Figure 4A:
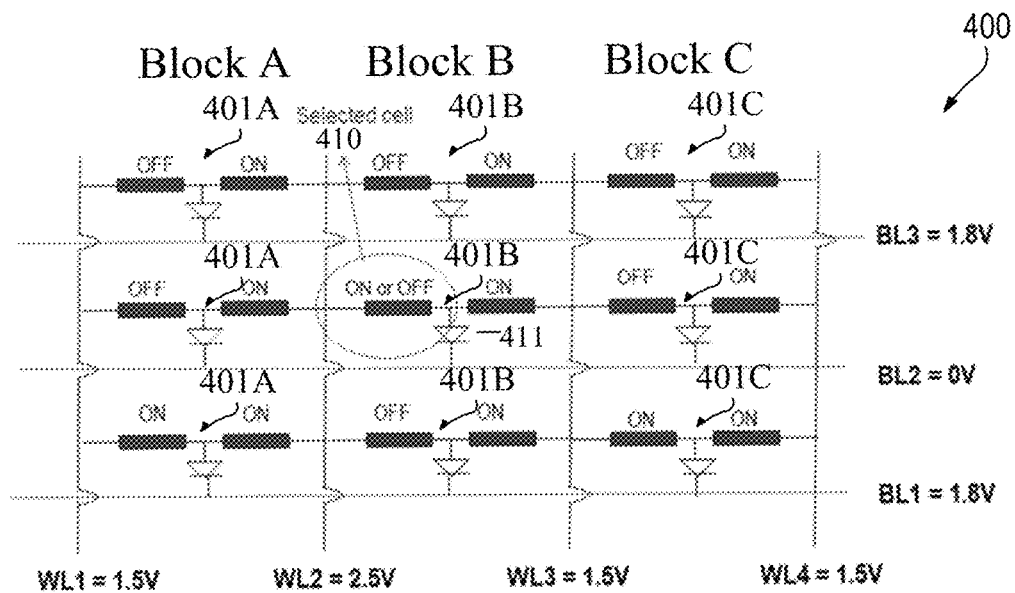
FIG. 4A is a diagram of an embodiment of a DiRAM array during a program or read operation.
Figure 4B:
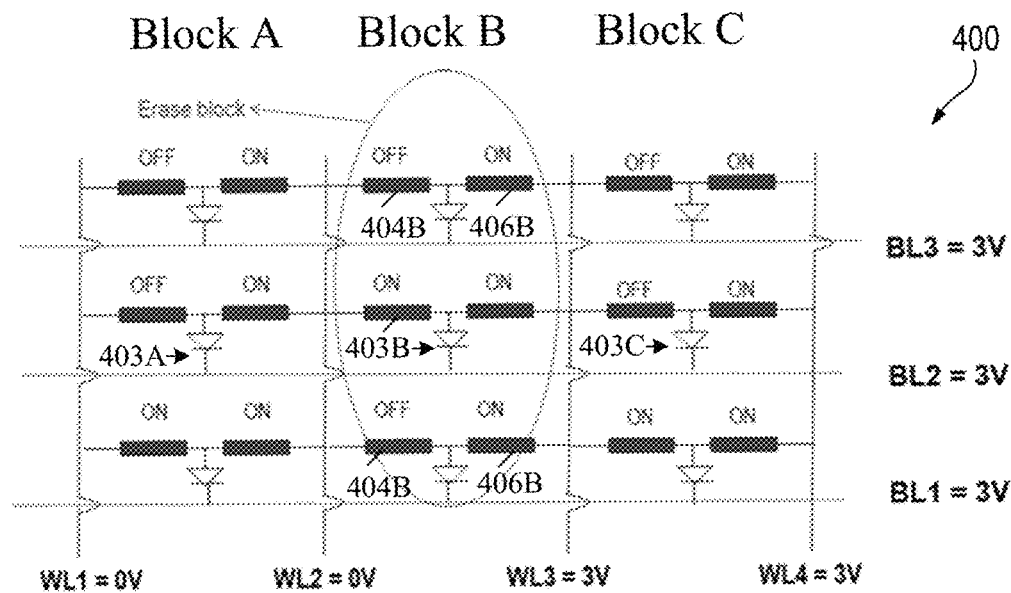
FIG. 4B is a diagram of an embodiment of a DiRAM array during an erase operation.

FIGS. 4A and 4B illustrate embodiments of a DiRAM array 400 during a program, read, or erase operation. Referring to FIGS. 4A and 4B, a DiRAM array 400 comprises a plurality of memory cells 401A, 401B, and 401C arranged in columns and rows, with word line signals, e.g., WL1, WL2, WL3, and WL4, arranged in a column direction and bit line signals, e.g., BL1, BL2, and BL3, arranged in a row direction between blocks A, B, and C. In block A, memory cells 401A are electrically coupled between adjacent pairs of word line signals WL1 and WL2 arranged in a column direction. Memory cells 401B in block B and memory cells 401C in block C are likewise electrically coupled between adjacent pairs of word line signals WL2 and WL3 and word line signals WL3 and WL4, respectively. Note that in difference to DiRAM 300, DiRAM 400 includes word line signals that are shared between adjacent blocks. In an embodiment, word line signal WL2 is shared between adjacent blocks A and B and word line signal WL3 is shared between adjacent blocks B and C. Doing so beneficially reduces the minimum feature size F of the cell from $8F^2$ to $5F^2$.

The program, read, and erase operations for DiRAM 400 are similar to the program, read, and erase operations for DiRAM 300 detailed above. Shared word line signals between adjacent blocks of memory cells, however, necessitate adjustment of the applied bias voltages in each of these operations.

Exemplary operating characteristics of memory cell 401A are as follows:
  SET=1.5V, 1 uA
  RESET=−1.5V, 1 uA
  ON/OFF resistance=1 Mohm, 50 Mohm
  Switching element, e.g., element 403A, delivers 1 uA at 1V In an embodiment in which memory cell 410 in block B is selected for a program or a read operation as shown in FIG. 4A, bit line signals BL1 and BL3 of unselected memory cells are set to 1.8V, while bit line signal BL2 of selected memory cell 410 is set to ground. Word line signal WL2 of selected memory cell 410 is set to a program or read voltage, e.g., 2.5V, while word line signals WL1, WL3, and WL4 of unselected memory cells are set to, e.g., 1.5V. By so biasing DiRAM 400, switching element 411 associated with selected memory cell 410 is turned on to thereby provide downstream control circuitry (not shown) applied to word line signals, e.g., WL1, WL2, WL3, and WL4, with a current capable of being measured to determine the stored bit value (in the case of a read operation) or a current capable of programming memory cell 410 (in the case of a program operation). The program operation may involve biasing DiRAM 400 with higher voltages than those involved in biasing DiRAM 400 for the read operation. A person of ordinary skill in the art should recognize that the bias levels indicated above are only exemplary and may vary depending on a variety of factors including design or manufacturing constraints. Downstream control circuitry configured to control memory cell 100 is well known to a person of ordinary skill in the art and will not be explained in any further detail herein.

The erasing operation occurs at a block level for DiRAM 400 much as it does for DiRAM 300, during which the switching elements 403A, 403B, and 403C remain turned off. In an embodiment in which Block B with memory cells 401B are selected for an erase operation as shown in FIG. 4B, all bit line signals BL1, BL2, and BL3 are set to an erase voltage, e.g., 3V, while word lines WL2 and WL3 associated with block B are biased such that a voltage drop appears across first resistive memory elements 404B while switching elements 403B remain turned off. In an embodiment, word line signals WL2 and WL3 are set to ground and 3V, respectively.

The series combination of first resistive memory element 404A and second resistive memory element 406B act as a voltage divider to divide the voltage drop between word line signal WL3 and word line signal WL2 causing a current to flow from second resistive memory element 406B to first resistive memory element 404B. If the erase current is high enough, it may change the state of first resistive memory element 404B from ON to OFF. Note that only first resistive memory elements 404B will change state since the polarity of first resistive memory elements 404B is suitable for a state change while second resistive memory elements 406B will not change state due to their polarity being complementary to the polarity of first resistive memory elements 404B.

A person of ordinary skill in the art should recognize that the bias levels indicated above are only exemplary and may vary depending on a variety of factors including design or manufacturing constraints. DiRAM 400 is applicable to several types of rewritable memory cells, and biases applied to arrays may be different than those shown in the exemplary FIGS. 4A and 4B.

Figure 5:
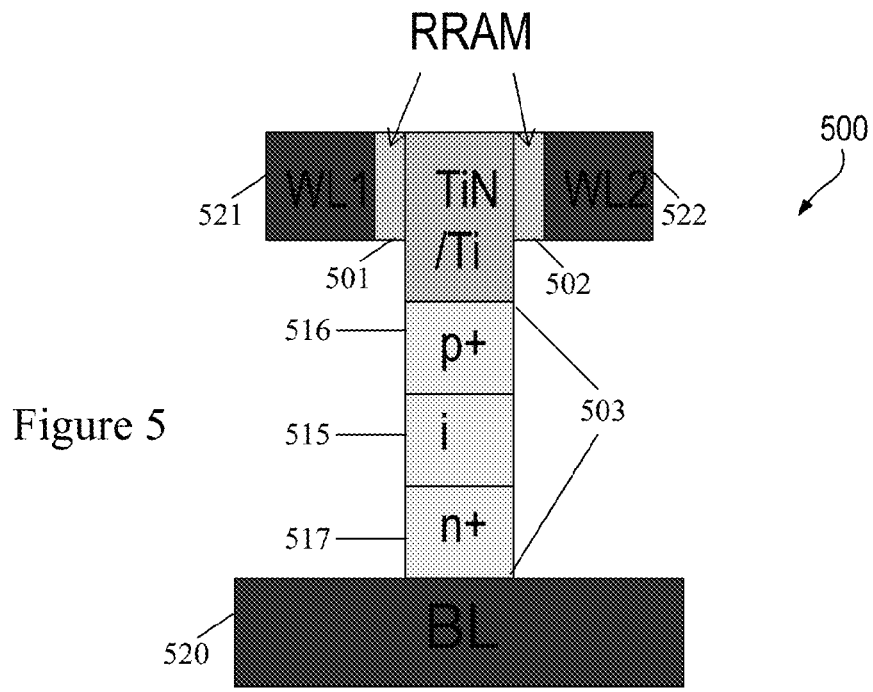
FIG. 5 is a diagram of an embodiment of a memory cell according to the present disclosure.

FIG. 5 is a diagram of an embodiment of a memory cell 500. Referring to FIG. 5, memory cell 500 includes a first resistive memory element 501, a second resistive memory element 502, and a switching element 503. DiRAM 400, for example, may comprise a plurality of memory cells 500. First resistive memory element 501 or second resistive memory element 502 may comprise non-volatile resistive memory of any technology that retains stored information in the absence of power. Examples of non-volatile resistive memory technology include resistive random access memory (RRAM) and the like. First resistive memory element 501 and second resistive memory element 502 may comprise a complementary memory cell in which first resistive memory element 501 has a polarity that is different, opposite, or complementary to that of second resistive memory element 502.

Switching element 503 may be electrically coupled to a common node, in turn, electrically coupled to first resistive memory element 501 and second resistive memory element 502. Switching element 503 may comprise any two-terminal switching device of any technology known to a person of ordinary skill in the art, e.g., a polysilicon diode. Switching element 503 may comprise a pin diode having a lightly doped intrinsic semiconductor region 515 sandwiched between a p+ semiconductor region 516 and an n+ semiconductor region 517. Switching element 503 may start conducting at any of a variety of settings, including e.g., 0.7V. Switching element 503 may have minimal leakage, e.g., in the sub-pA, in the reverse direction.

Bit line terminal 520 to receive bit line signal, e.g., BL1, is formed of e.g., tungsten or other like material and serves as a platform against which to form switching element 503. Word line terminals 521 and 522 to receive word line signals WL1 and WL2 are arranged on either side of first resistive memory element 501 and second resistive memory element 502. First resistive memory element 501 and second resistive memory element 502 may be arranged as sidewalls of switching element 503.

Figure 6:
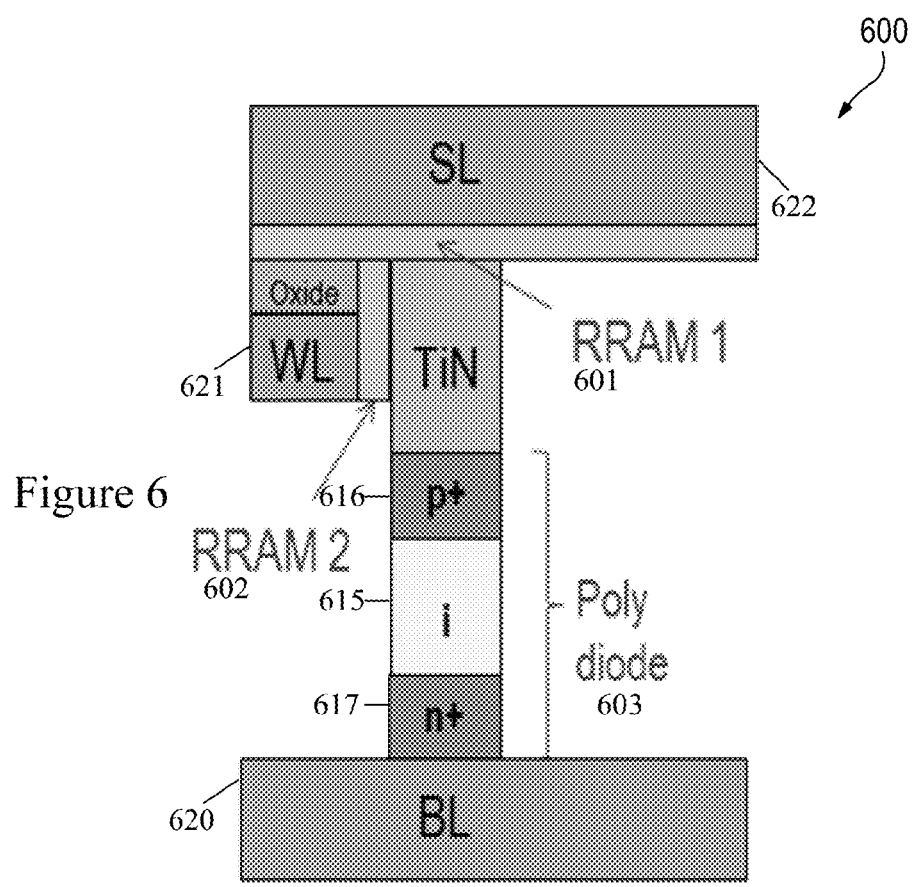
FIG. 6 is a diagram of an embodiment of a memory cell according to the present disclosure.

FIG. 6 is a diagram of an embodiment of a memory cell 600. Referring to FIG. 6, memory cell 600 includes a first resistive memory element 601, a second resistive memory element 602, and a switching element 603. Similar to memory cell 500, first resistive memory element 601 or second resistive memory element 602 may comprise non-volatile resistive memory of any technology that retains stored information in the absence of power. Examples of non-volatile resistive memory technology include resistive random access memory (RRAM) and the like. First resistive memory element 601 and second resistive memory element 602 may comprise a complementary memory cell in which first resistive memory element 601 has a polarity that is opposite or complementary to that of second resistive memory element 602.

Switching element 603 may be electrically coupled to a common node, in turn, electrically coupled to first resistive memory element 601 and second resistive memory element 602. Switching element 603 may comprise any two-terminal switching device of any technology known to a person of ordinary skill in the art, e.g., a polysilicon diode. Switching element 603 may comprise a pin diode having a lightly doped intrinsic semiconductor region 615 sandwiched between a p+ semiconductor region 616 and an n+ semiconductor region 617. Switching element 603 may start conducting at any of a variety of settings, including e.g., 0.7V. Switching element 603 may have minimal leakage, e.g., in the sub-pA, in the reverse direction.

Bit line terminal 620 to receive a bit line signal, e.g., BL1, is formed of e.g., tungsten or other like material, and serves as a platform against which to form switching element 603. Word line terminal 621 is configured to receive a word line signal, e.g., WL, and electrically coupled to second resistive memory element 602. Select line terminal 622 is configured to receive a select line signal, e.g., SL, and electrically coupled to first resistive memory element 601. In an embodiment, word line terminal 621 and select line terminal 622 are formed perpendicularly to each other. In an embodiment, select line signal SL is configured to select individual memory cells, e.g., memory cell 600, for an erase or a program operation on DiRAM 700 as explained in more detail below.

Figure 7:
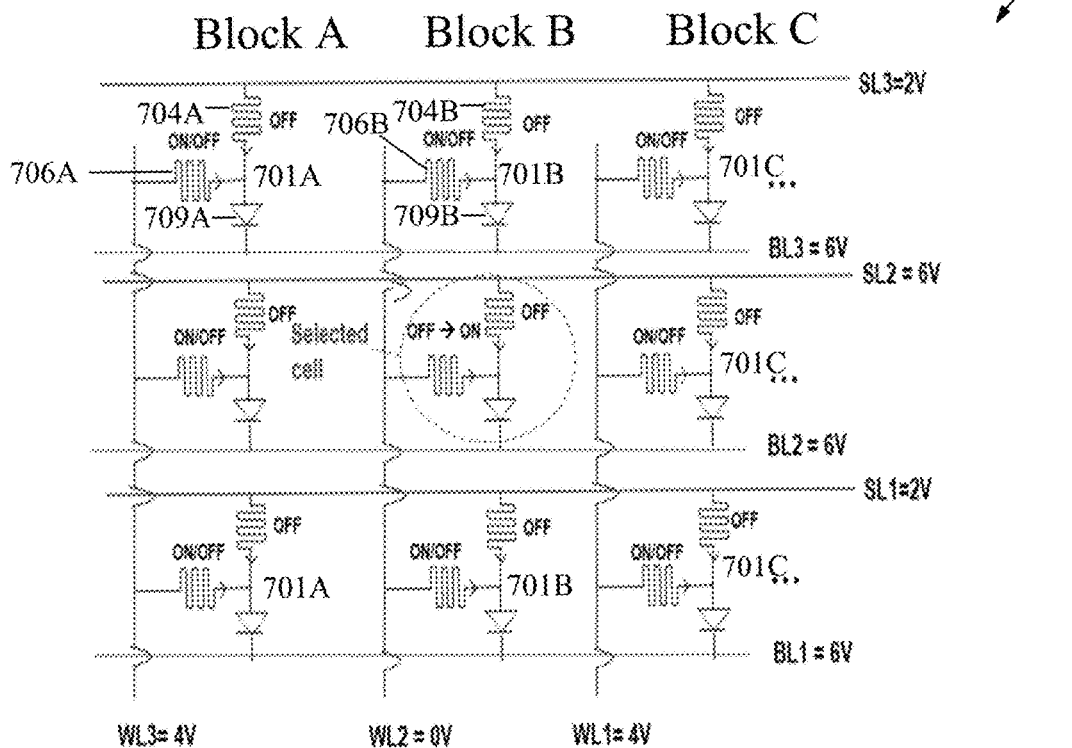
FIG. 7 illustrates an embodiment of a DiRAM during a bit-by-bit erase operation.

FIG. 7 illustrates an embodiment of a DiRAM 700 during a bit-by-bit erase operation. Referring to FIG. 7, DiRAM 700 comprises a plurality of memory cells 701A, 701B, and 701C arranged in columns and rows, with word line signals WL1, WL2, and WL3, arranged in a column direction and bit line signals BL1, BL2, and BL3, arranged in a row direction. In an embodiment, select line signals SL1, SL2, and SL3, are arranged in a row direction, parallel to bit line signals BL1, BL2, and BL3. In an embodiment, select line signals SL1, SL2, and SL3 allow a bit-by-bit erase operation on DiRAM 700.

Exemplary memory cell 701A may comprise a first resistive memory element 706A electrically coupled to word line signal WL3, a second resistive memory element 704A electrically coupled to select line signal SL3, and a switching element 709A electrically coupled to bit line signal BL3. Exemplary memory cell 701B may comprise a first resistive memory element 706B electrically coupled to word line signal WL2, a second resistive memory element 704B electrically coupled to select line signal SL3, and a switching element 709B electrically coupled to bit line signal BL3. The remaining plurality of memory cells in DiRAM 700 are likewise coupled to a word line signal, a select line signal, and a bit line signal as shown in FIG. 7.

The addition of select line signals to DiRAM 700 allows selection of individual memory cells for an erase or a program operation. In an embodiment, each memory cell in DiRAM 700 may store multiple bits of data by creating an asymmetry between the ON and OFF resistance values of the first and second resistive memory elements. The asymmetry may be achieved in various ways including changing current compliance, having different device operation parameters (e.g., voltage and/or currents), having different device physical properties (e.g., different materials, different electrodes, thickness values, and the like), having different types of resistive change/switch memories, and the like. A person of ordinary skill in the art will recognize other ways in which asymmetry between the first and second resistive memory elements may be achieved depending on various factors including design or manufacturing constraints.

Figures 8A, 8B:
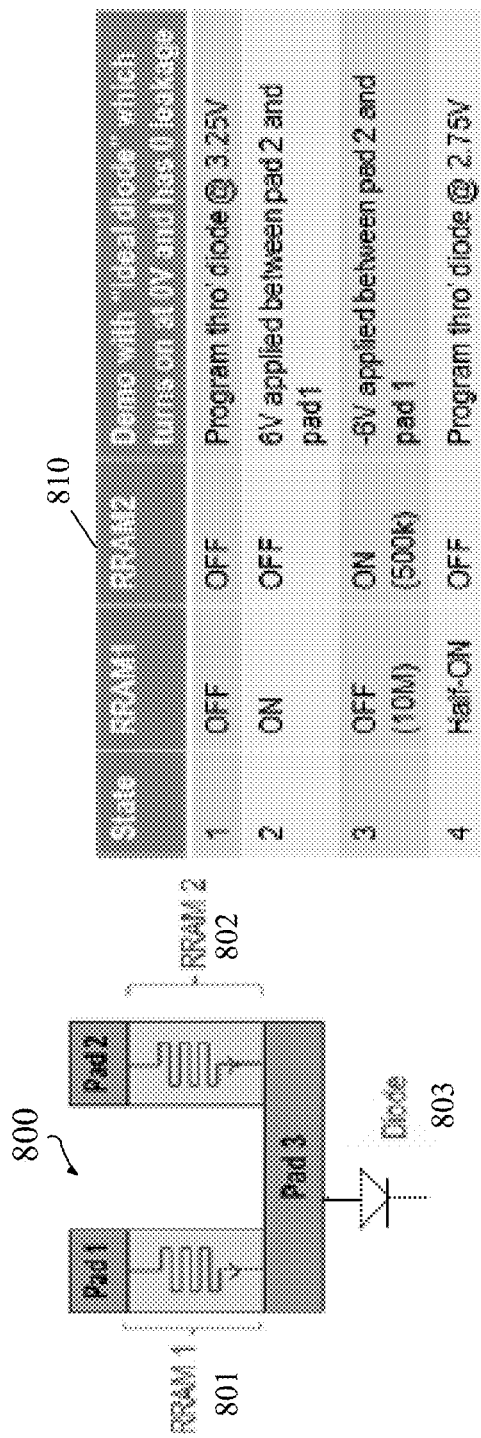
FIG. 8A is a diagram of an embodiment of a memory cell according to the present disclosure.
FIG. 8B is a diagram of a table demonstrating multi-bit per cell operation.

FIG. 8A illustrates a memory cell 800 and FIG. 8B illustrates a table 810 demonstrating multi-bit per cell operation for memory cell 800. Referring to FIGS. 8A and 8B, in an embodiment, memory cell 800 includes a first resistive memory element 801, a second resistive memory element 802, and a switching element 803.

Figures 9A, 9B:
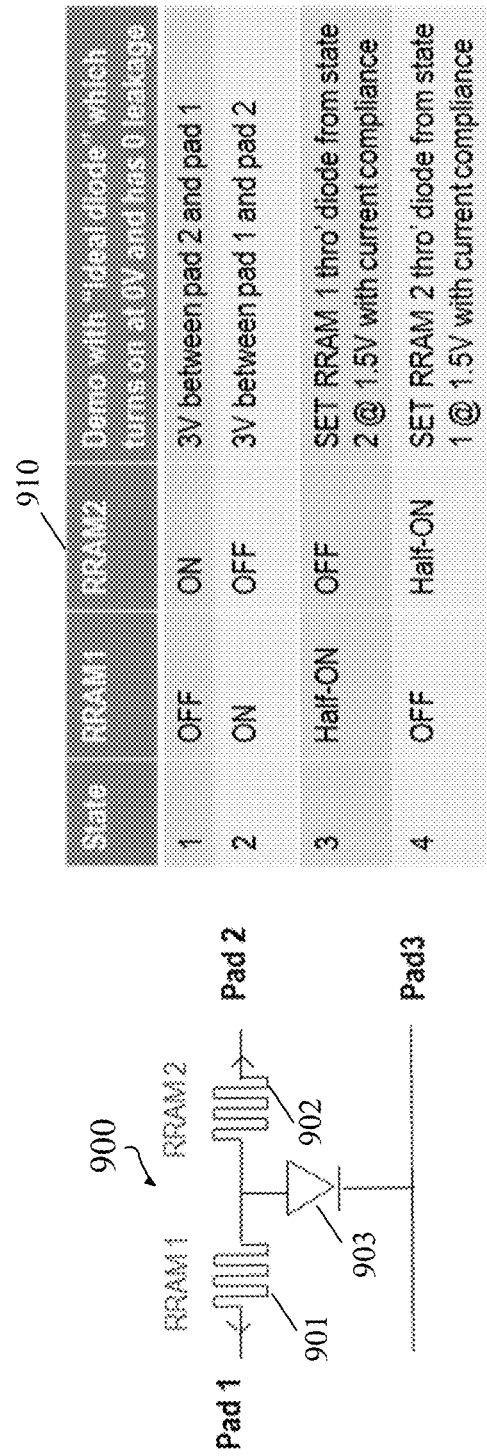
FIG. 9A is a diagram of an embodiment of a memory cell according to the present disclosure.
FIG. 9B is a diagram of a table demonstrating multi-bit per cell operation.

Memory cell 800 may have three stored states using ON and OFF modes of the first and second resistive memory elements 801 and 802. Memory cell 800 may have a fourth state using an intermediary resistance value of the first or second resistive memory elements 801 or 802. Exemplary operating characteristics of a memory cell 800 are as follows:
FORM=none
RESET (ON to OFF)=+3.25V at 1 uA
SET (OFF to ON)=−3.25V at 1 uA
READ=0.5V, 50 nA ON, 5 nA OFF FIG. 9A illustrates a memory cell 900 and FIG. 9B illustrates a table 910 demonstrating multi-bit cell operation for memory cell 900. In an embodiment, memory cell 900 is a filamentary-type RRAM device including a first resistive memory element 901, a second resistive memory element 902, and a switching element 903. Memory cell 900 may have the following exemplary operating characteristics:
FORM=3V
SET=1.5V at 1 uA
RESET=−1.5V at 1 uA Memory cell 900 may FORM through the switching element 903 to keep device voltages and driver sizes low. In an embodiment, memory cell 900 would need current compliance to move to the half-ON state. ON/ON resistance may be avoided to prevent sneak leakage.

A person of ordinary skill in the art will recognize that they may make many changes to the details of the above-described memory device without departing from the underlying principles. Only the following claims, however, define the scope of the memory device.

The invention claimed is:

1. A memory cell, comprising:
a first resistive memory element, wherein a first end of the first resistive memory element is physically connected with a select line;
a second resistive memory element electrically coupled with a word line and with a second end of the first resistive memory element at a common node; and
a two-terminal switching element electrically coupled with the common node.

2. The memory cell of claim 1,
wherein the first resistive memory element comprises a first polarity; and
wherein the second resistive memory element comprises a second polarity complementary to the first polarity.

3. The memory cell of claim 1,
wherein the two-terminal switching element comprises a polysilicon diode or a complementary metal-oxide semiconductor (CMOS) diode.

4. The memory cell of claim 1,
wherein the two-terminal switching element is electrically coupled with a bit line.

5. The memory cell of claim 1,
wherein the memory cell is configured to store at least two bits of information based at least in part on the first resistive memory element or the second resistive memory element being configured in a first state, a second state, a third state, or combinations thereof;
wherein the first state is a high resistance state;
wherein the second state is a low resistance state; and
wherein the third state is an intermediate resistance state.

6. A memory device, comprising:
a plurality of resistive memory cells, each resistive memory cell comprising:
a first resistive memory element, wherein a first end of the first resistive memory element is physically connected with a select line;
a second resistive memory element electrically coupled with a word line and with a second end of the first resistive memory element at a common node; and
a two-terminal switching element electrically coupled with the common node at a first terminal and with a bit line at a second terminal.

7. The memory device of claim 6,
wherein the first resistive memory element comprises a first polarity; and
wherein the second resistive memory element comprises a second polarity different from the first polarity.

8. The memory device of claim 6, further comprising:
wherein the word line is arranged in a first direction; and
wherein the bit line is arranged in a second direction different from the first direction.

9. The memory device of claim 6,
wherein the plurality of resistive memory cells are arranged in an array;
wherein a plurality of word lines are arranged in a column direction in the array; and
wherein each resistive memory cell is coupled to a first word line at a first cell terminal and a second word line at a second cell terminal.

10. The memory device of claim 6,
wherein the plurality of resistive memory cells are arranged in an array;

wherein a plurality of word lines are arranged in a column direction in the array; and wherein adjacent resistive memory cells are electrically coupled with a common word line.

11. The memory device of claim 6, wherein a resistive memory cell comprising the first resistive memory element and the second resistive memory element is configured to store at least two bits of data based at least in part on the first resistive memory element or the second resistive memory element being configured in a first state, a second state, a third state, or combinations thereof;

wherein the first state is a high resistance state;

wherein the second state is a low resistance state; and wherein the third state is an intermediate resistance state.

12. A method, comprising:

selecting an operation from reading, writing, or erasing; and in response to the operation selected:
    applying a select voltage to a select line physically connected with a first end of a first resistive memory element of a memory cell;
    applying a word line voltage to a word line electrically coupled with a second resistive memory element of the memory cell; and
    applying a bit line voltage to a bit line electrically coupled with a two-terminal switching element of the memory cell;

wherein a second end of the first resistive memory element is coupled with the second resistive memory element and the two-terminal switching element at a common node.

13. The method of claim 12, further comprising:

substantially simultaneously erasing each memory cell in a block of the plurality of the memory cells in response to selecting erasing as the operation.

14. The method of claim 12, further comprising:

erasing a single memory cell in a block of the memory cells in response to selecting erasing as the operation.

15. The method of claim 12, further comprising:

storing at least two bits of data in the memory cell based at least in part on the first resistive memory element or the second resistive memory element being configured in a first state, a second state, or a third state.

* * * * *